United States Patent
Tsukuda et al.

(10) Patent No.: US 9,263,949 B2
(45) Date of Patent: Feb. 16, 2016

(54) VOLTAGE CONVERSION CIRCUIT AND ELECTRONIC CIRCUIT

(71) Applicant: Sony Corporation, Tokyo (JP)

(72) Inventors: Yasunori Tsukuda, Kanagawa (JP); Yuki Yagishita, Kanangawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/608,293

(22) Filed: Jan. 29, 2015

(65) Prior Publication Data

US 2015/0244266 A1 Aug. 27, 2015

(30) Foreign Application Priority Data

Feb. 24, 2014 (JP) ................................. 2014-033194

(51) Int. Cl.
  *G05F 5/00* (2006.01)
  *H02M 7/5383* (2007.01)
  *H02M 1/00* (2007.01)
  *H02M 3/158* (2006.01)

(52) U.S. Cl.
  CPC .................................. *H02M 3/158* (2013.01)

(58) Field of Classification Search
  USPC ......... 323/241, 244, 282, 283, 299, 300, 303; 363/65, 74, 75, 78, 115
  See application file for complete search history.

(56) References Cited

U.S. PATENT DOCUMENTS

| 5,561,385 | A | * | 10/1996 | Choi | ........................ | G05F 1/465 |
|---|---|---|---|---|---|---|
| | | | | | | 327/536 |
| 8,373,425 | B2 | * | 2/2013 | Garg | ......................... | G01B 7/14 |
| | | | | | | 188/723 E |
| 2012/0153909 | A1 | * | 6/2012 | Bucossi | .................. | H02M 1/15 |
| | | | | | | 323/271 |
| 2015/0109042 | A1 | * | 4/2015 | Ma | ........................... | H03K 5/14 |
| | | | | | | 327/262 |
| 2015/0263737 | A9 | * | 9/2015 | Choudhary | ............... | H03L 7/07 |
| | | | | | | 327/158 |

FOREIGN PATENT DOCUMENTS

JP 2012-105277 5/2012

* cited by examiner

*Primary Examiner* — Adolf Berhane
*Assistant Examiner* — Gary Nash
(74) *Attorney, Agent, or Firm* — Michael Best & Friedrich LLP

(57) ABSTRACT

A voltage conversion circuit includes: a first voltage conversion unit configured to perform voltage conversion on an input signal, the voltage conversion causing a predetermined delay time, and supply a resultant signal as a first converted signal; a second voltage conversion unit configured to perform voltage conversion on the input signal, the voltage conversion causing a delay time that is different from the predetermined delay time, and supply a resultant signal as a second converted signal; and an output unit configured to generate and output an output signal corresponding to the first and second converted signals in a matching period of time in which voltages of the first converted signal and the second converted signal are matched with each other, and continuously output the output signal in a period of time excluding the matching period of time, the output signal being output in the matching period of time.

8 Claims, 12 Drawing Sheets

| Converted signal A3 | Converted signal B3 | Output signal OUT |
|---|---|---|
| L | L | H |
| L | H | Hold state |
| H | L | Hold state |
| H | H | L |

FIG.4

| Power-supply voltage of inverter | Voltage of input signal | Type of input signal | Delay time of inverter |
|---|---|---|---|
| V1 | V1 | Rising edge | T_1R(40ps) |
| | | Falling edge | T_1F(35ps) |
| V2 | V1 | Rising edge | T_2R+dR (=40+20=60ps) |
| | | Falling edge | T_2F+dF (=45+85=130ps) |
| | V2 | Rising edge | T_2R(40ps) |
| | | Falling edge | T_2F(45ps) |

FIG.5A

| Input signal IN | Delay time in voltage conversion unit 210 | Delay time in voltage conversion unit 220 | Delay time difference when dF≫dR ∝ Duty ratio |
|---|---|---|---|
| Rising edge | T_1R+T_1F +(T_2R+dR) | T_1R+ (T_2F+dF) +T_2R | T_1F−T_2R (=35−40=−5ps) |
| Falling edge | T_1F+T_1R +(T_2F+dF) | T_1F+ (T_2R+dR) +T_2F | |

FIG.5B

VOLTAGE CONVERSION CIRCUIT AND ELECTRONIC CIRCUIT

CROSS REFERENCE TO RELATED APPLICATIONS

This application claims the benefit of Japanese Priority Patent Application JP 2014-033194 filed Feb. 24, 2014, the entire contents of which are incorporated herein by reference.

BACKGROUND

The present disclosure relates to a voltage conversion circuit and an electronic circuit. More specifically, the present disclosure relates to a voltage conversion circuit and an electronic circuit for voltage conversion causing a delay time.

In the past, semiconductor integrated circuits such as LSI (Large Scale Integration) have been managed in many cases by being divided into a plurality of regions (hereinafter, referred to as "power-supply domains") with different power-supply voltages in order to efficiently use power. In such semiconductor integrated circuits, a level converter that converts the voltage of a signal is provided between the power-supply domains in order to propagate the signal accurately. The level converter includes a plurality of logic inversion elements such as inverters. Those logic inversion elements may have differences in delay time between a rising edge and a falling edge. So, there is a risk that a period of time from the rising edge to the falling edge of the signal with the changed voltage varies as compared to the case before the conversion. Such a variation is desirably small in terms of preventing malfunction of the circuit.

In this regard, in order to reduce the variation in the period of time from the rising edge to the falling edge, a level shifter is proposed which includes two voltage shifter circuits connected to an input-side circuit in parallel (see, for example, Japanese Patent Application Laid-open No. 2012-105277). Those two voltage shifter circuits convert voltages of input clock signals and generate output clock signals having different delay times of the rising edge and the falling edge. Those voltage shifter circuits have respective output terminals connected to an output-side circuit in common and output a clock signal of a logical value of a so-called wired OR (logical sum).

SUMMARY

In the above-mentioned technique in related art, however, the voltage shifter circuits have a difference in delay time, and thus a period of time is generated in which one of the two output clock signals is in high level and the other one is in low level. In this period of time, the signal of the logical sum has an unstable potential that is intermediate between high level and low level. If this period of time of the unstable potential is sufficiently short, the variation in the period of time from the rising edge to the falling edge is suppressed, but if not, the variation becomes large. As a result, there is a risk that the signals are not transmitted accurately.

In view of such circumstances, there is a need for transmitting signals accurately.

According to a first embodiment of the present disclosure, there is provided a voltage conversion circuit including a first voltage conversion unit, a second voltage conversion unit, and an output unit. The first voltage conversion unit is configured to perform voltage conversion on an input signal, the voltage conversion causing a predetermined delay time, and supply a resultant signal as a first converted signal. The second voltage conversion unit is configured to perform voltage conversion on the input signal, the voltage conversion causing a delay time that is different from the predetermined delay time, and supply a resultant signal as a second converted signal. The output unit is configured to generate and output an output signal corresponding to the first converted signal and the second converted signal in a matching period of time in which a voltage of the first converted signal and a voltage of the second converted signal are matched with each other, and continuously output the output signal in a period of time excluding the matching period of time, the output signal being output in the matching period of time. This configuration produces such an effect that the output signal corresponding to the first converted signal and the second converted signal is output in the matching period of time in which the voltage of the first converted signal and the voltage of the second converted signal are matched with each other, and the output signal that is output in the matching period of time is continuously output in a period of time excluding the matching period of time.

Additionally, in the first embodiment, each of the first voltage conversion unit and the second voltage conversion unit may include the same number of logic inversion elements. In the first voltage conversion unit, the number of logic inversion elements to which the same voltage as a voltage of the input signal is supplied may be one more than the number of logic inversion elements of the second voltage conversion unit, and in the second voltage conversion unit, the number of logic inversion elements to which the same voltage as a voltage of the output signal is supplied may be one more than the number of logic inversion elements of the first voltage conversion unit. This configuration produces such an effect that in the first voltage conversion unit, the number of logic inversion elements to which the same voltage as a voltage of the input signal is supplied is one more than the number of logic inversion elements of the second voltage conversion unit, and in the second voltage conversion unit, the number of logic inversion elements to which the same voltage as a voltage of the output signal is supplied is one more than the number of logic inversion elements of the first voltage conversion unit.

Additionally, in the first embodiment, the output unit may be configured to connect one of a power-supply terminal and a reference terminal to an output terminal in a case where the voltage of the first converted signal and the voltage of the second converted signal are matched with each other, the reference terminal having a potential lower than a potential of the power-supply terminal, and output a signal of the potential of the connected terminal as the output signal from the output terminal, and to continuously output the output signal without connecting any one of the power-supply terminal and the reference terminal to the output terminal, in a case where the voltage of the first converted signal and the voltage of the second converted signal are not matched with each other. This configuration produces such an effect that any of the power-supply terminal and the reference terminal is not connected to the output terminal in a case where the voltage of the first converted signal and the voltage of the second converted signal are not matched with each other.

Additionally, in the first embodiment, the output unit may include a first transistor configured to connect one of the power-supply terminal and the reference terminal to a first node in a case where the voltage of the second converted signal is in low level, a second transistor configured to connect the first node to the output terminal in a case where the voltage of the first converted signal is in low level, a third transistor configured to connect a second node to the output terminal in a case where the voltage of the first converted signal is in high level, and a fourth transistor configured to connect the one of the power-supply terminal and the reference terminal to the second node in a case where the voltage of the second signal is in high level. This configuration produces such an effect that any of the power-supply terminal and the reference terminal is not connected to the output terminal in a case where the voltage of the first converted signal and the voltage of the second converted signal are not matched with each other.

Additionally, in the first embodiment, the output unit may include a set-signal-generating unit configured to generate a logical conjunction signal of the first converted signal and the second converted signal, as a set signal, a reset-signal-generating unit configured to generate a logical conjunction signal of a signal obtained by inverting the first converted signal and a signal obtained by inverting the second converted signal, as a reset signal, and a latch circuit configured to output a signal as the output signal, the signal having a voltage that is the same as one of a voltage of the set signal and a voltage of the reset signal, in a case where the voltage of the set signal and the voltage of the reset signal are not matched with each other, and to hold and output the output signal in a case where the voltage of the set signal and the voltage of the reset signal are matched with each other. This configuration produces such an effect that the output signal is held in a case where the voltage of the set signal and the voltage of the reset signal are matched with each other.

Additionally, in the first embodiment, the voltage conversion circuit may further include a control-signal-generating unit and a flip-flop. The control-signal-generating unit is configured to generate a control signal indicating whether the voltage of the first converted signal and the voltage of the second converted signal are matched with each other or not. The flip-flop is configured to output one of the first converted signal and the second converted signal as the output signal in a case where the control signal indicates that the voltage of the first converted signal and the voltage of the second converted signal are matched with each other, and to hold and output the output signal in a case where the control signal indicates that the voltage of the first converted signal and the voltage of the second converted signal are not matched with each other. This configuration produces such an effect that the output signal is held in a case where the control signal indicates that the voltage of the first converted signal and the voltage of the second converted signal are not matched with each other.

Additionally, in the first embodiment, at least one of the first voltage conversion unit and the second voltage conversion unit may include an input-side logic inversion element configured to delay the input signal and supply a resultant signal as a delay signal, an amplifier unit configured to amplify the delay signal, and an output-side logic inversion element configured to perform voltage conversion on the amplified delay signal, the voltage conversion causing a delay time that is different from the predetermined delay time, and output a resultant signal as the output signal. This configuration produces such an effect that the delay signal is amplified.

According to a second embodiment of the present disclosure, there is provided an electronic circuit including a first voltage conversion unit, a second voltage conversion unit, an output unit, and a processing circuit. The first voltage conversion unit is configured to perform voltage conversion on an input signal, the voltage conversion causing a predetermined delay time, and supply a resultant signal as a first converted signal. The second voltage conversion unit is configured to perform voltage conversion on the input signal, the voltage conversion causing a delay time that is different from the predetermined delay time, and supply a resultant signal as a second converted signal. The output unit is configured to generate and output an output signal corresponding to the first converted signal and the second converted signal in a matching period of time in which a voltage of the first converted signal and a voltage of the second converted signal are matched with each other, and continuously output the output signal in a period of time excluding the matching period of time, the output signal being output in the matching period of time. The processing circuit is configured to perform predetermined processing using the output signal. This configuration produces such an effect that the output signal corresponding to the first and second converted signals is output in the matching period of time in which the voltage of the first converted signal and the voltage of the second converted signal are matched with each other, and the output signal that is output in the matching period of time is continuously output in the period of time excluding the matching period of time.

According to the present disclosure, an excellent effect of transmitting signals accurately can be produced. It should be noted that the effects described herein are not necessarily limited and any one of the effects described herein may be produced.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 4 is a diagram showing an operation example of the output unit according to the first embodiment;

FIGS. 5A and 5B are diagrams showing an example of delay times of inverters and delay time differences in the first embodiment;

DETAILED DESCRIPTION OF EMBODIMENTS

Hereinafter, modes for carrying out the present disclosure (hereinafter, referred to as embodiments) will be described. The description will be given in the following order.

1. First Embodiment (example of holding output signal in period of time in which voltages are not matched)
2. Second Embodiment (example of amplifying signal and holding output signal in period of time in which voltages are not matched)
3. Third Embodiment (example of holding output signal using latch in period of time in which voltages are not matched)
4. Fourth Embodiment (example of holding output signal using flip-flop in period of time in which voltages are not matched)

1. First Embodiment (Configuration Example of Semiconductor Integrated Circuit)

Figure 1:
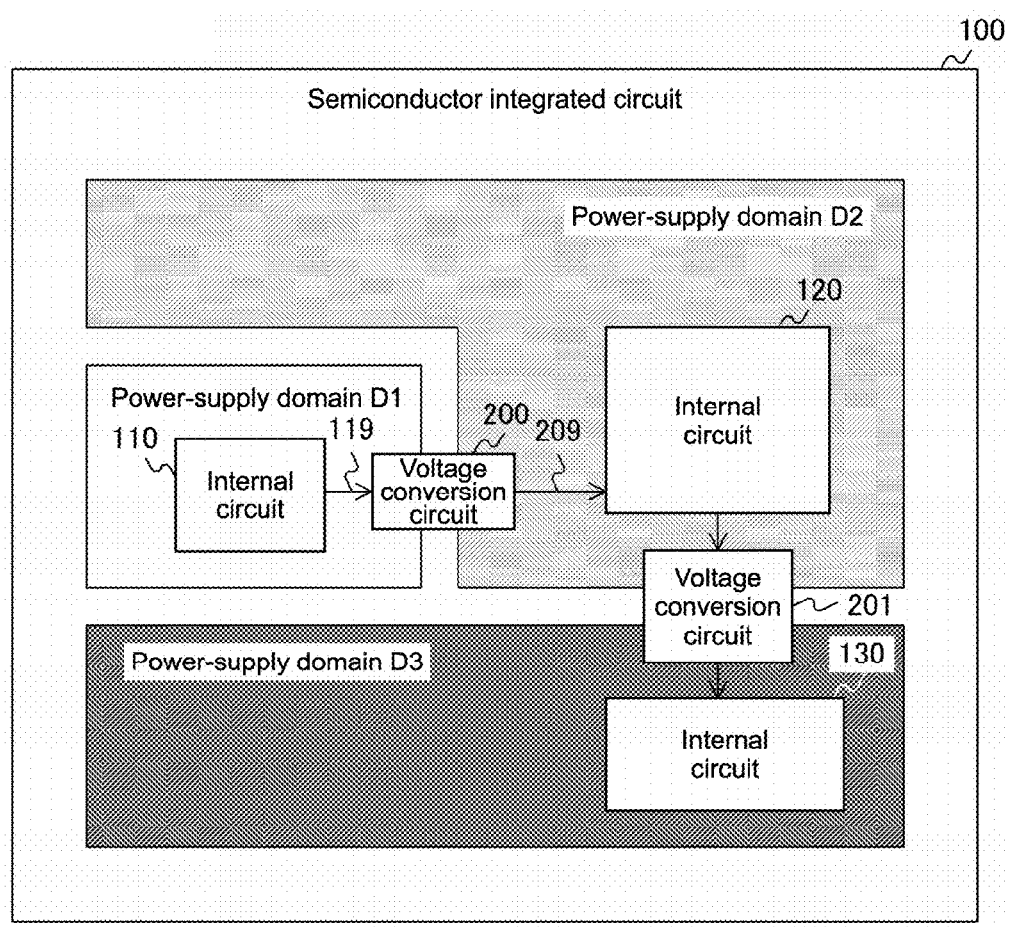
FIG. 1 is a block diagram showing a configuration example of a semiconductor integrated circuit according to a first embodiment.

FIG. 1 is a block diagram showing a configuration example of a semiconductor integrated circuit 100 according to a first embodiment. For the semiconductor integrated circuit 100, for example, an LSI (Large Scale Integration) used in image processing, communication processing, measurement processing, and the like is assumed. Additionally, examples of electronic apparatuses including the semiconductor integrated circuit 100 include digital cameras, TV (television) receivers, game devices, wireless communications devices, and sensor modules.

The semiconductor integrated circuit 100 includes power-supply domains, which are a plurality of regions with different power-supply voltages. For example, the semiconductor integrated circuit 100 includes three power-supply domains, i.e., power-supply domains D1, D2, and D3. Of those domains, the power-supply domain D1 is provided with an internal circuit 110, and the power-supply domain D2 is provided with an internal circuit 120. Additionally, the power-supply domain D3 is provided with an internal circuit 130. Furthermore, a voltage conversion circuit 200 is provided at the boundary of the power-supply domains D1 and D2, and a voltage conversion circuit 201 is provided at the boundary of the power-supply domains D2 and D3. It should be noted that the semiconductor integrated circuit 100 is an example of an electronic circuit described in the section "What is claimed is".

The internal circuit 110 generates a signal such as a data signal and a clock signal and supplies the signal to the voltage conversion circuit 200 via a signal line 119. The voltage conversion circuit 200 converts the voltage of the signal supplied from the internal circuit 110 and supplies the resultant signal to the internal circuit 120 via a signal line 209.

The internal circuit 120 performs predetermined processing by using the signal supplied from the voltage conversion circuit 200. The internal circuit 120 generates and supplies the signal to the voltage conversion circuit 201. The voltage conversion circuit 201 converts the voltage of the signal supplied from the internal circuit 120 and supplies a resultant signal to the internal circuit 130. The internal circuit 130 performs predetermined processing by using the signal supplied from the voltage conversion circuit 201. It should be noted that the internal circuits 120 and 130 are examples of a processing circuit described in the section "What is claimed is".

(Configuration Example of Voltage Conversion Circuit)

Figure 2:
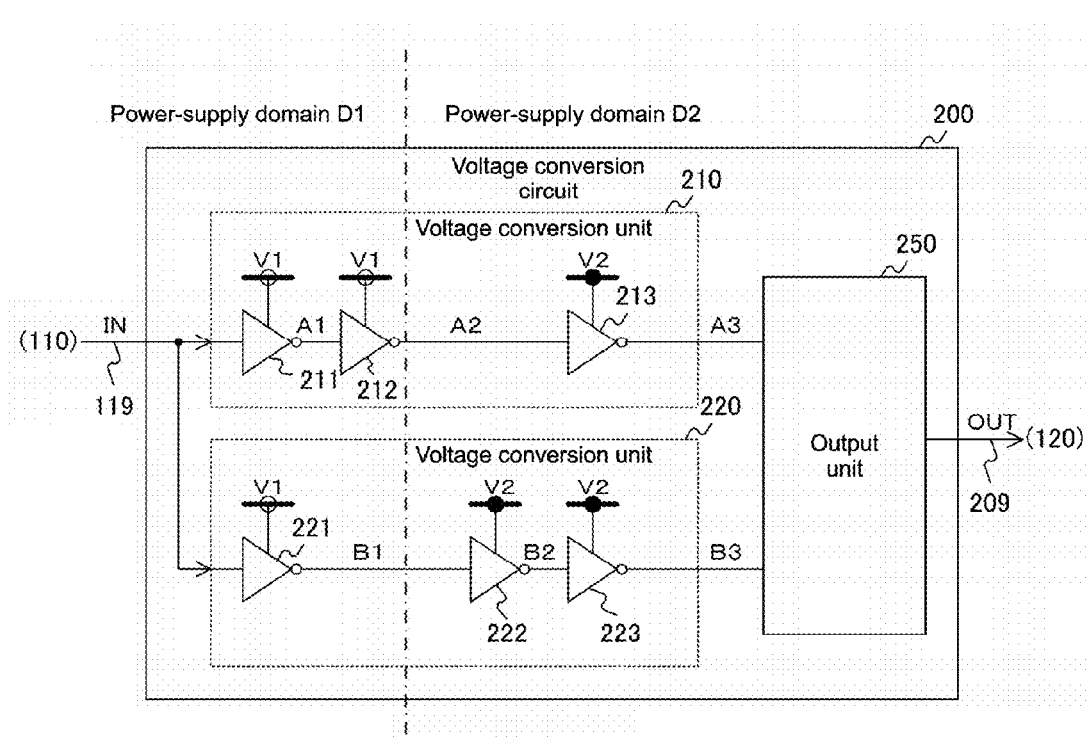
FIG. 2 is a circuit diagram showing a configuration example of a voltage conversion circuit according to the first embodiment.

FIG. 2 is a block diagram showing a configuration example of the voltage conversion circuit 200 according to the first embodiment. The voltage conversion circuit 200 includes voltage conversion units 210 and 220 and an output unit 250.

Each of the voltage conversion units 210 and 220 performs voltage conversion on an input signal. The voltage conversion of the respective voltage conversion units 210 and 220 causes different delay times. The voltage conversion unit 210 includes N+1 logic inversion elements to which a power-supply voltage V1 is supplied, and M logic inversion elements to which a power-supply voltage V2 is supplied. Here, N is an integer of 0 or more, and M is an integer of 0 or more. Meanwhile, the voltage conversion unit 220 includes N logic inversion elements to which the power-supply voltage V1 is supplied, and M+1 logic inversion elements to which the power-supply voltage V2 is supplied.

In FIG. 2, it is assumed that the values N and M are 1 and inverters serving as logic inversion elements are provided. In this case, the voltage conversion unit 210 includes inverters 211 and 212 to which the power-supply voltage V1 is supplied, and an inverter 213 to which the power-supply voltage V2 is supplied. Additionally, in this case, the voltage conversion unit 220 includes an inverter 221 to which the power-supply voltage V1 is supplied, and inverters 222 and 223 to which the power-supply voltage V2 is supplied. The configuration of the voltage conversion circuit 201 is the same as that of the voltage conversion circuit 200.

The inverter 211 inverts and delays an input signal. The configurations of the inverters 212, 213, 221, 222, and 223 are the same as that of the inverter 211. Although the configurations of those inverters are identical to one another, the delay times of the respective inverters are not necessarily identical to one another. This is because the delay times of the inverters vary due to various conditions such as the power-supply voltages supplied to the inverters, the voltages of signals input to the inverters, and information on whether the signal is a rising edge or not.

Additionally, the power-supply voltage V2 of the inverters 213 and 222 is different from the voltage V1 of the input signal. Specifically, those inverters each output a signal with a voltage that is converted from V1 to V2. Such a signal with a converted voltage is hereinafter referred to as "converted signal".

The inverter 211 receives an input signal IN, which is a signal input from the internal circuit 110, inverts the signal, and supplies the resultant signal to the inverter 212 of a subsequent stage. The resultant signal serves as a delay signal A1. The inverter 212 inverts the delay signal A1 supplied from the inverter 211 and supplies the resultant signal to the inverter 213 of a subsequent stage. The resultant signal serves as a delay signal A2. The inverter 213 inverts the delay signal A2 supplied from the inverter 212 and supplies the resultant signal to the output unit 250 of a subsequent stage. The resultant signal serves as a converted signal A3.

Meanwhile, the inverter 221 inverts the input signal IN supplied from the internal circuit 110 and supplies the resultant signal to the inverter 222 of a subsequent stage. The resultant signal serves as a delay signal B1. The inverter 222 inverts the delay signal B1 supplied from the inverter 221 and supplies the resultant signal to the inverter 223 of a subsequent stage. The resultant signal serves as a converted signal B2. The inverter 223 inverts the converted signal B2 supplied from the inverter 222 and supplies the resultant signal to the output unit 250 of a subsequent stage. The resultant signal serves as a converted signal B3.

As described above, the delay times of the logic inversion elements such as the inverter 211 take different values due to a difference in power-supply voltage and the like. So, the delay times of a rising edge and a falling edge of the converted signal B3 with respect to the input signal IN take values that are different from those of the converted signal A3. As a result, a period of time occurs in which the voltage of the converted signal A3 and the voltage of the converted signal B3 are not matched with each other.

The output unit 250 generates and outputs an output signal OUT corresponding to those signals, in a period of time in which the voltage of the converted signal A3 and the voltage of the converted signal B3 are matched with each other. For example, the output unit 250 inverts the converted signal A3 or B3 in a period of time in which their voltages are matched with each other. The output unit 250 outputs the resultant signal as an output signal OUT. Additionally, in a period of time in which the voltage of the converted signal A3 and the voltage of the converted signal B3 are not matched with each other, the output unit 250 continuously outputs the output signal OUT, which is output in the period of time in which the voltages are matched with each other.

It should be noted that the inverters 211, 212, and 221 are examples of an input-side logic inversion element described in the section "What is claimed is". Additionally, the inverters 213, 222, and 223 are examples of an output-side logic inversion element described in the section "What is claimed is".

(Configuration Example of Output Unit)

Figure 3:
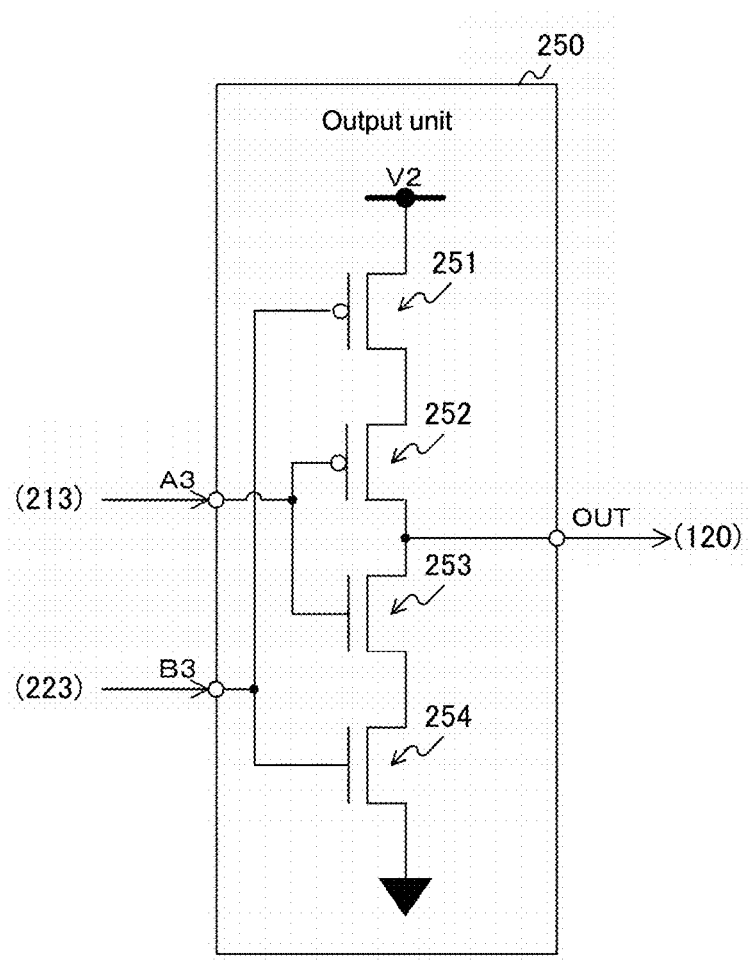
FIG. 3 is a circuit diagram showing a configuration example of an output unit according to the first embodiment.

FIG. 3 is a block diagram showing a configuration example of the output unit 250 according to the first embodiment. The output unit 250 includes transistors 251, 252, 253, and 254. The transistors 251 and 252 are p-type MOS (Metal-Oxide-Semiconductor) transistors, for example. Additionally, the transistors 253 and 254 are n-type MOS transistors, for example.

A gate terminal of the transistor 251 is connected to the inverter 223, a source terminal thereof is connected to the transistor 252, and a drain terminal thereof is connected to a power-supply terminal. The power-supply terminal is a terminal to which the power-supply voltage V2 is applied. A gate terminal of the transistor 252 is connected to the inverter 213, a source terminal thereof is connected to the transistor 253 and to an output terminal, and a drain terminal thereof is connected to the transistor 251. The output terminal is a terminal connected to the output-side internal circuit 120.

A gate terminal of the transistor 253 is connected to the inverter 213, a drain terminal thereof is connected to the transistor 252 and to the output terminal, and a source terminal thereof is connected to the transistor 254. A gate terminal of the transistor 254 is connected to the inverter 223, a drain terminal thereof is connected to the transistor 253, and a source terminal thereof is connected to a reference terminal. The reference terminal is a terminal to which a reference voltage is applied. The reference voltage is lower than the power-supply voltage V2. In those transistors, a parasitic capacitance is formed between the source terminal and the drain terminal, for example.

In the case where both of the converted signals A3 and B3 are in high level, only the transistors 253 and 254 enter an on-state, and a signal in low level (reference voltage) is output to serve as the output signal OUT. Additionally, in the case where both of the converted signals A3 and B3 are in low level, only the transistors 251 and 252 enter an on-state, and a signal in high level (power-supply voltage V2) is output to serve as the output signal OUT.

Additionally, in the case where the converted signal A3 is in high level and the converted signal B3 is in low level, only the transistors 251 and 253 enter an on-state. So, both of the power-supply terminal and the reference terminal are not connected to the output terminal, and a signal of a potential held in a parasitic capacitance of the transistor 252 or 254 is output as the output signal OUT. Furthermore, in the case where the converted signal A3 is in low level and the converted signal B3 is in high level, only the transistors 252 and 254 enter an on-state, and a signal of a potential held in a parasitic capacitance of the transistor 251 or 253 is output as the output signal OUT.

In summary, in a period of time in which the voltages of the converted signals A3 and B3 are matched with each other, the inverted signal of the converted signal A3 or B3 is output as the output signal OUT. Meanwhile, in a period of time in which the voltages of the converted signals A3 and B3 are not matched with each other, the output unit 250 enters a hold state in which the voltage in the period of time in which the voltages of the converted signals A3 and B3 are matched with each other is held. The output signal OUT of that voltage is then continuously output.

It should be noted that the transistors 251, 252, 253, and 254 are examples of first, second, third, and fourth transistors described in the section "What is claimed is".

Additionally, in the period of time in which the voltages of the converted signals A3 and B3 are matched with each other, the output unit 250 outputs an inverted signal of any of the converted signals as the output signal OUT, but may output the converted signal as the output signal OUT without inversion. In this case, for example, n-type MOS transistors are provided to serve as the transistors 251 and 252, and p-type MOS transistors are provided as the transistors 253 and 254.

(Operation Example of Output Unit)

FIG. 4 is a diagram showing an operation example of the output unit 250 according to the first embodiment. In a period of time in which the converted signals A3 and B3 are both in low level (L), the output unit 250 outputs the output signal OUT in high level (H). Additionally, in a period of time in which the converted signals A3 and B3 are both in high level (H), the output unit 250 outputs the output signal OUT in low level (L).

Additionally, in a period of time in which one of the converted signals A3 and B3 is in high level (H) and the other signal is in low level (L), the output unit 250 moves to a hold state in which the last level is hold. Additionally, in this hold state, the impedance of the output unit 250 becomes very high, and a leakage current from the voltage conversion units 210 and 220 to the output-side internal circuit 120 is blocked.

FIGS. 5A and 5B are diagrams showing an example of delay times and delay time differences in the first embodiment. FIG. 5A is a diagram showing delay times of the logic inversion elements (such as the inverter 211) under various conditions.

The delay times of the logic inversion elements differ depending on whether a signal to be input is a rising edge or a falling edge. For example, in the case where the power-supply voltage of a logic inversion element and the voltage of a signal to be input to the logic inversion element are each V1, a delay time of a rising edge is T_1R, while a delay time of a falling edge is T_1F. T_1R is 40 picoseconds (ps), for example. T_1F is 35 picoseconds (ps), for example.

Additionally, also when the power-supply voltage of the logic inversion element differs, a difference in delay time is caused. For example, in the case where the power-supply voltage of a logic inversion element and the voltage of a signal to be input to the logic inversion element are each V2, a delay time of a rising edge is T_2R, and a delay time of a falling edge is T_2F. T_2R is 40 picoseconds (ps), for example. T_2F is 45 picoseconds (ps), for example.

Furthermore, when the voltage of a signal to be input to the logic inversion element differs, a difference in delay time is caused. For example, in the case where the power-supply voltage of a logic inversion element is V2 and a signal of the voltage V1 is input to the logic inversion element, a delay time of a rising edge is T_2R+dR, and a delay time of a falling edge is T__2F+dF. dR is 20 picoseconds (ps), for example. dF is 85 picoseconds, for example. In particular, in the inverters 213 and 222 that are disposed across the boundary of the power-supply domains, the voltages of the signals to be input to the respective inverters are different from each other, and thus the difference in delay time is increased. For that reason, at the boundary of the power-supply domains, the variation of the delay time is increased.

FIG. 5B is a diagram showing a difference in delay time between the voltage conversion units 210 and 220. When a rising edge is input to the voltage conversion units 210 and 220, as seen from FIG. 5A, at the first-, second-, and third-stage inverters in the voltage conversion unit 210, delay times of T__1R, T__1F, and T2R+dR are caused, respectively. Meanwhile, at the first-, second-, and third-stage inverters in the voltage conversion unit 220, delay times of T__1R, T__2F+dF, and T__2R are caused, respectively.

Additionally, when a falling edge is input to the voltage conversion units 210 and 220, as seen from FIG. 5A, at the first-, second-, and third-stage inverters in the voltage conversion unit 210, delay times of T__1F, T__1R, and T2F+dF are caused, respectively. Meanwhile, at the first-, second-, and third-stage inverters in the voltage conversion unit 220, delay times of T__1F, T__2R+dR, and T__2F are caused, respectively.

Here, in the case where dR is significantly smaller than dF, the delay time of the rising edge becomes longer in the voltage conversion unit 220, and the delay time of the falling edge becomes longer in the voltage conversion unit 210. In this case, a difference between a period of time from the rising to the falling of the output signal OUT (that is, pulse width) and a pulse width of the input signal IN is equal to a difference between the delay time of the rising edge in the voltage conversion unit 220 and the delay time of the falling edge in the voltage conversion unit 210. This difference between the delay times is a difference between T__1F and T__2R, which is equal to 5 picoseconds. Assuming that a clock signal is the input signal IN and a ratio of the pulse width to a period, which is equal to a pulse width divided by period, is a duty ratio, the amount of variation in duty ratio is significantly small and corresponds to 5 picoseconds.

In such a manner, the output unit 250 generates an output signal in the period of time in which the voltages are matched with each other and continuously outputs the output signal in the period of time in which the voltages are not matched with each other. This leads to a reduction in difference between the delay times of the rising edge and the falling edge, thus suppressing variations in duty ratio.

In particular, in a high-speed signal typified by a clock signal, in general, as the variations in duty ratio at transmission become larger, the upper limit of an operating frequency is set to be lower. So, the suppression of the variations in duty ratio allows such a high-speed signal to be accurately transmitted and the operating frequency to be improved. Additionally, propagation of a signal to a power-supply domain with a relatively-low voltage is allowed, and low power consumption of integrated circuits is allowed. In addition, the voltage conversion circuit 200 has a minimum structure and suffices a small number of necessary elements, and thus an increase in costs due to an increase in circuit mounting area can be almost ignorable.

Furthermore, since the voltage conversion circuit 200 is not a circuit that directly corrects the duty ratio, the voltage conversion circuit 200 produces another effect of transmitting data signals. In the transmission of data signals, the variations in duty ratio are made small, so that a holding circuit having a short setup time can be provided to serve as a holding circuit that receives a data signal on the output side.

In the case where dF is significantly smaller than dR, the output signal OUT having a duty ratio, which corresponds to the difference between the delay time of the rising edge in the voltage conversion unit 210 and the delay time of the falling edge in the voltage conversion unit 220, is generated. This difference in delay time is a difference between T__1R and T__2F, which is equal to 5 picoseconds.

Figure 6:
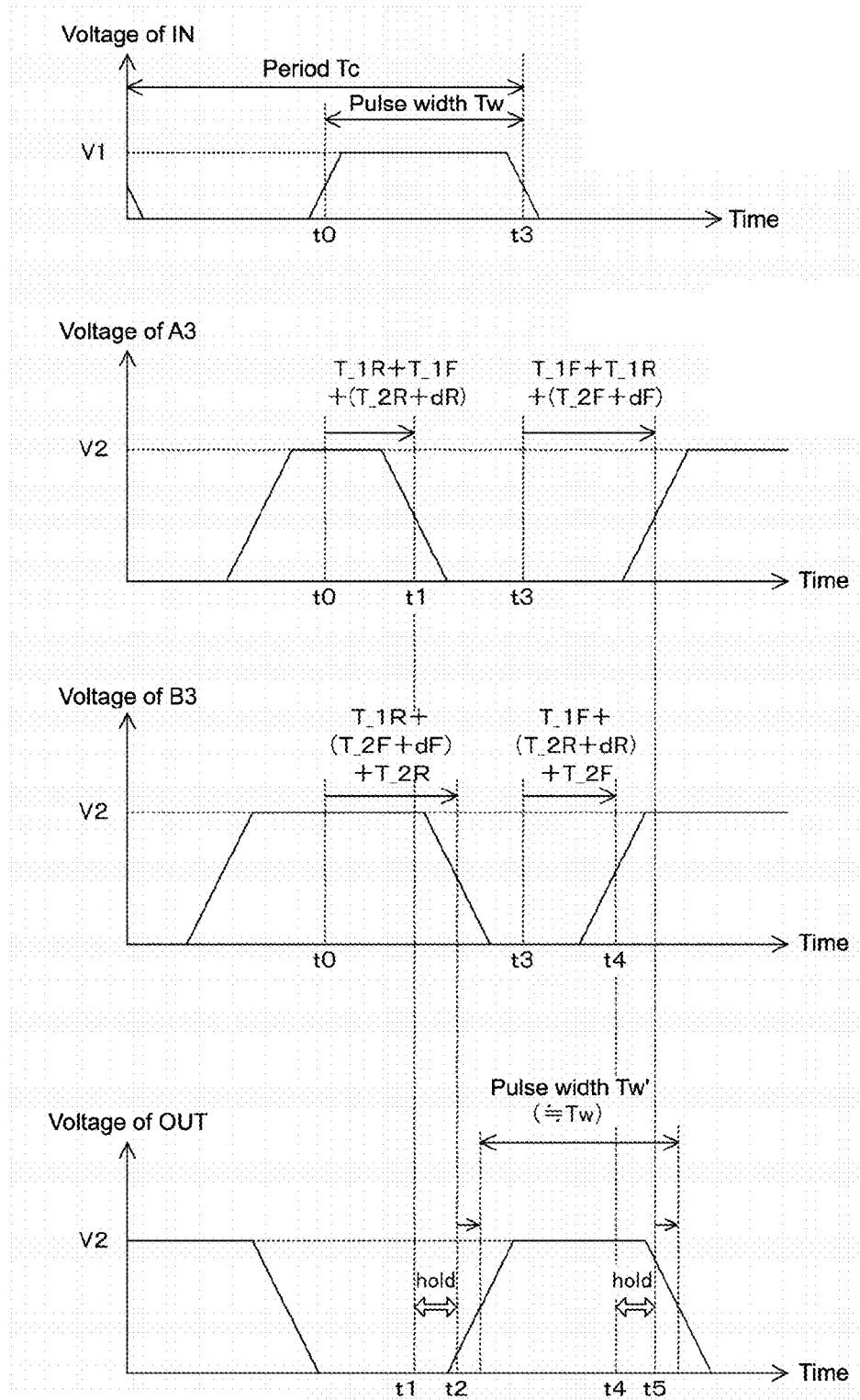
FIG. 6 is a diagram showing exemplary waveforms of an input signal, converted signals, and an output signal in the first embodiment.

FIG. 6 is a diagram showing exemplary waveforms of the input signal, the converted signals, and the output signal in the first embodiment. The uppermost part of FIG. 6 shows an exemplary waveform of the input signal IN. For example, a signal having a peak voltage V1, a period Tc, and a pulse width Tw is input to the voltage conversion circuit 200 to serve as the input signal IN. A timing of the rising edge of the input signal IN in a certain period is assumed as t0, and a timing of the falling edge thereof is assumed as t3.

The upper-second part of FIG. 6 shows an exemplary waveform of the converted signal A3 supplied from the voltage conversion unit 210. The peak voltage of the converted signal A3 is converted into V2, and its falling edge is delayed by T__1R+T__1F+(T__2R+dR) with respect to the timing t0, and its rising edge is delayed by T__1F+T__1R+(T__2F+dF) with respect to the timing t3. A timing of the falling edge of the converted signal A3 is assumed as t1, and a timing of the rising edge thereof is assumed as t5.

The lower-second part of FIG. 6 shows an exemplary waveform of the converted signal B3 supplied from the voltage conversion unit 220. The peak voltage of the converted signal B3 is converted into V2, and its falling edge is delayed by T__1R+(T__2F+dF)+T__2R with respect to the timing t0, and its rising edge is delayed by T__1F+(T__2R+dR)+T__2F. A timing of the falling edge of the converted signal B3 is assumed as t2, and a timing of the rising edge thereof is assumed as t4.

Here, in the case where dR is significantly smaller than dF, as exemplified in the upper-second part and the lower-second part of FIG. 6, a delay time (t2−t0) of the falling edge of the converted signal B3 with respect to the input signal IN is longer than a delay time (t1−t0) of the falling edge of the converted signal A3 with respect to the input signal IN. Additionally, a delay time (t5−t3) of the rising edge of the converted signal A3 with respect to the input signal IN is longer than a delay time (t4−t3) of the falling edge of the converted signal B3 with respect to the input signal IN. Due to the differences of those delay times, a period of time is generated in which the voltages of the converted signals A3 and B3 are not matched with each other.

The lowermost part of FIG. 6 shows an exemplary waveform of the output signal OUT supplied from the output unit 250. As shown in the lowermost part of FIG. 6, in the period of time in which the voltages of the converted signals A3 and B3 are not matched with each other, the output unit 250 enters a hold state and continuously outputs the output signal OUT of the period of time in which the voltages of the converted signals A3 and B3 are matched with each other. As a result, a difference between the pulse width Tw of the input signal IN and a pulse width Tw' of the output signal OUT is equal to a difference between the delay time (t5−t3) of the rising edge of the converted signal A3 and the delay time (t2−t0) of the falling edge of the converted signal B3. This difference in delay time (that is, difference in pulse width) is, for example, a difference between T__1R and T__2F (5 picoseconds, for example), which is an extremely small value. For example, the degree of variability of the duty ratio when the period is 500 picoseconds is suppressed to an extremely small amount of 1% (=5/500*100).

In contrast, in the case where the output unit 250 is not provided and in the case where the inverters 213 and 223, which are the last stages of the voltage conversion units 210 and 220, respectively, are connected in common to the output-side internal circuit 120 through a wired-OR connection, there is a risk of increasing variations in duty ratio.

Figure 7:
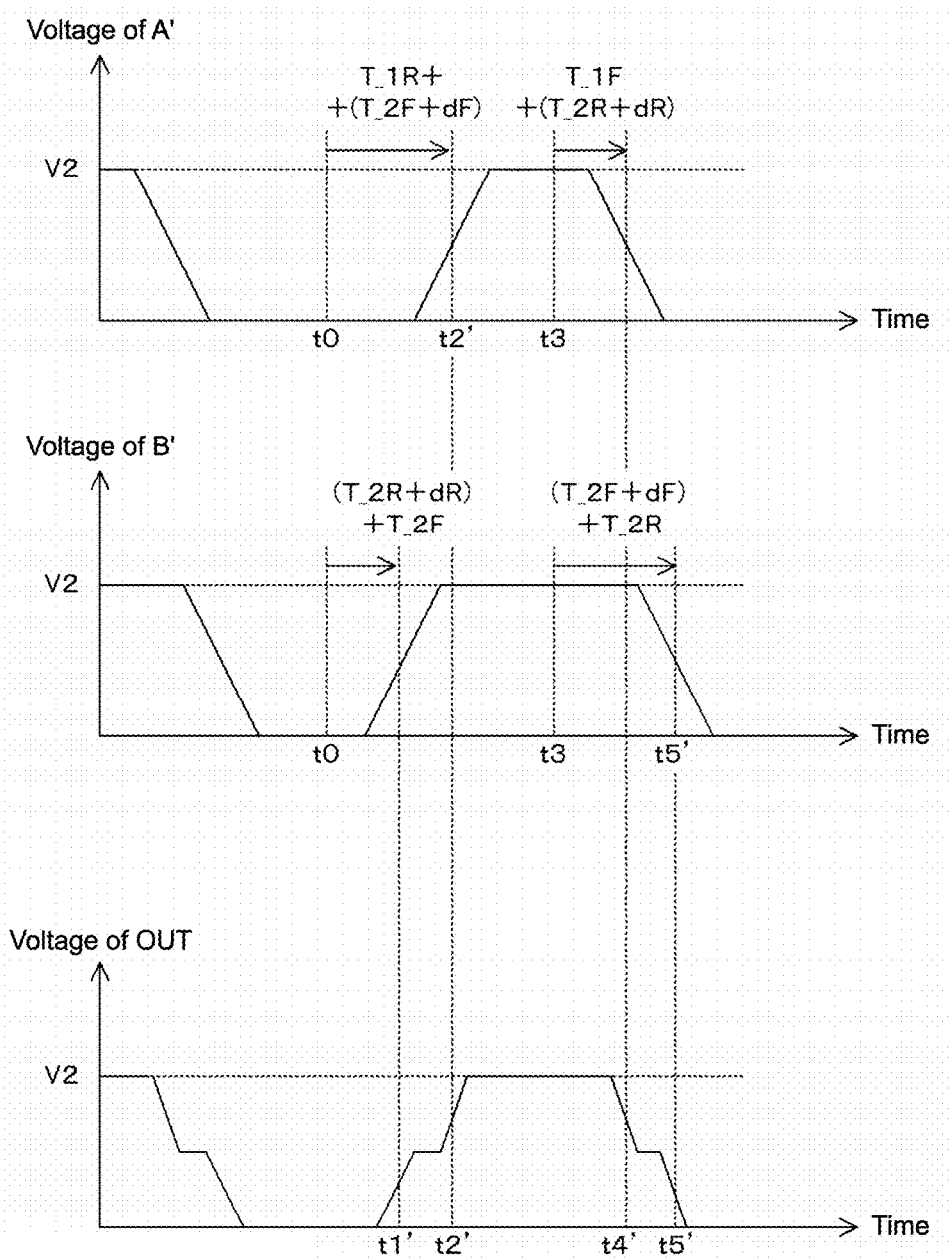
FIG. 7 is a diagram showing exemplary waveforms of converted signals and an output signal in a comparative example.

FIG. 7 is a diagram showing exemplary waveforms of converted signals and an output signal in a comparative example in which the inverters 211 and 221 and the output unit 250 are not provided and the inverters 213 and 223 at the last stages are connected in common to the internal circuit 120 through a wired-OR connection.

The upper part of FIG. 7 shows an exemplary waveform of a converted signal A' supplied from the inverter 213 of the comparative example. A rising edge of the converted signal A' is delayed by T__1R+(T__2F+dF) with respect to a timing t0, and a falling edge thereof is delayed by T__1F+(T__2R+dR) with respect to a timing t3. A timing of the falling edge of the converted signal A' is assumed as t2', and a timing of the rising edge thereof is assumed as t4'.

The middle part of FIG. 7 shows an exemplary waveform of a converted signal B' supplied from the inverter 223 of the comparative example. A rising edge of the converted signal B' is delayed by (T__2R+dR)+T__2F with respect to the timing t0, and a falling edge thereof is delayed by (T__2F+dF)+T__2R with respect to the timing t3. A timing of the rising edge of the converted signal B3 is assumed as t1', and a timing of the falling edge thereof is assumed as t5'.

The lower part of FIG. 7 shows an exemplary waveform of an output signal OUT of the comparative example. As shown in the lower part of FIG. 7, in the case of a wired-OR connection, in the period of time in which the voltages of the converted signals A3 and B3 are not matched with each other, an output signal OUT having an intermediate potential between the high level and the low level is output. For example, when the intermediate potential is determined to be high level on the output side, the amount of variations in pulse width is a difference between (t1'−t0) and (t5'−t3), which is 65 picoseconds (ps). The degree of variability of the duty ratio when the period is 500 picoseconds (ps) is 13% (=65/500*100), which is an extremely large value as compared to 1% in the case where the output unit 250 is provided.

As described above, according to the first embodiment of the present disclosure, in the period of time in which the voltages of two converted signals with different delay times are not matched with each other, the output signal generated in the period of time in which the voltages of the converted signals are matched with each other is continuously output. This can suppress the variations in duty ratio and lead to an accurate transmission of a signal.

(Modification)

In the first embodiment, although the output unit 250 generates an output signal by the transistors 251 to 254 connected in series, four more transistors may be further connected to those transistors in parallel to ensure drive power. An output unit 250 in a modification is different from that of the first embodiment in that four more transistors are further connected in parallel.

Figure 8:
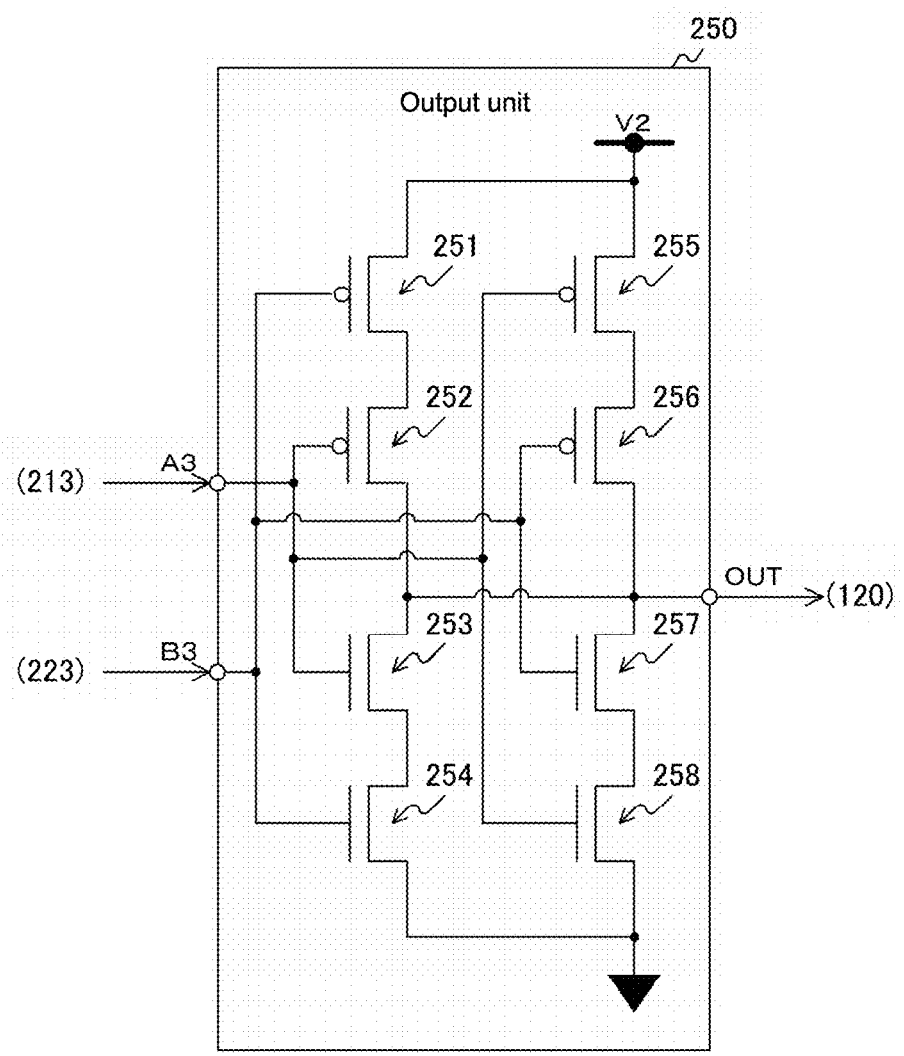
FIG. 8 is a circuit diagram showing a configuration example of an output unit according to a modification of the first embodiment.

FIG. 8 is a circuit diagram showing a configuration example of the output unit 250 in the modification of the first embodiment. The output unit 250 in the modification is different from that of the first embodiment in that transistors 255, 256, 257, and 258 are further provided.

A gate terminal of the transistor 255 is connected to the inverter 213, a source terminal thereof is connected to the transistor 256, and a drain terminal thereof is connected to a power-supply terminal. A gate terminal of the transistor 256 is connected to the inverter 223, a source terminal thereof is connected to the transistor 257 and to the output terminal, and a drain terminal thereof is connected to the transistor 255.

A gate terminal of the transistor 257 is connected to the inverter 223, a drain terminal thereof is connected to the transistor 256 and to the output terminal, and a source terminal thereof is connected to the transistor 258. A gate terminal of the transistor 258 is connected to the inverter 213, a drain terminal thereof is connected to the transistor 257, and a source terminal thereof is connected to a reference terminal.

As described above, in the transistors 251 to 254, the converted signals B3, A3, A3, and B3 are input to the transistors 251 to 254, respectively, from the near side of the power supply. In the transistors 255 to 258, however, the converted signals A3, B3, B3, and A3 are input to the transistors 255 to 258, respectively, from the near side of the power supply. In such a manner, the inputs of the transistors 251 to 254 (A3 and B3) are swapped and input to the circuit including the transistors 255 to 258. This can match the delay time, which is caused in the case where the logic of the output signal is determined by the logic of the voltage conversion unit 210, with the delay time, which is caused in the case where the logic of the output signal is determined by the logic of the voltage conversion unit 220. So, duty ratio breakage can be suppressed reliably.

As described above, according to the modification of the first embodiment, four more transistors are further connected in parallel, and thus the duty ratio breakage can be suppressed reliably.

2. Second Embodiment

In the first embodiment, in the input-side power-supply domain D1, the inverters 212 and 221 supply the delay signals A2 and B1 without change, respectively, to subsequent-stage inverters. In the case where the input-side power-supply voltage V1 is too low with respect to the output-side power-supply voltage V2, however, there is a risk that inverters at subsequent stages do not operate due to insufficient drive power. In this case, it is desirable to amplify those delay signals and then supply them to the subsequent-stage inverters. A voltage conversion circuit 200 according to a second embodiment is different from that of the first embodiment in that the delay signals are amplified.

Figure 9:
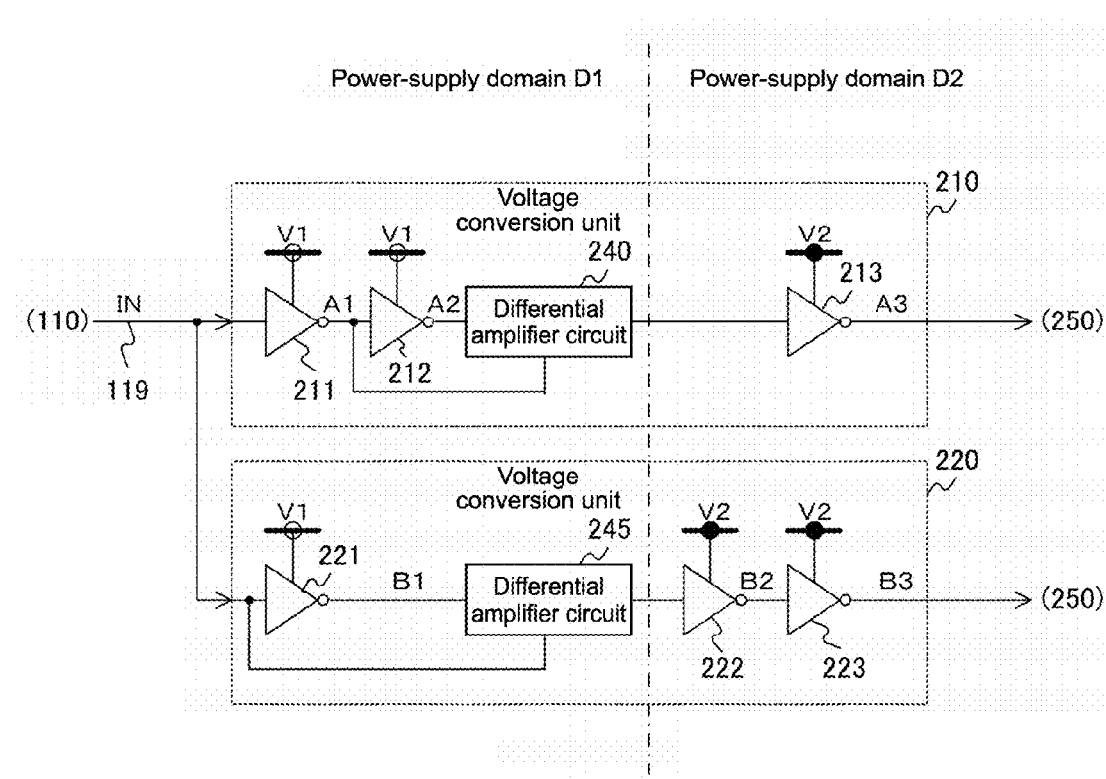
FIG. 9 is a circuit diagram showing a configuration example of a voltage conversion unit according to a second embodiment.

FIG. 9 is a circuit diagram showing a configuration example of voltage conversion units 210 and 220 according to the second embodiment. The voltage conversion unit 210 according to the second embodiment is different from that of the first embodiment in that a differential amplifier circuit 240 is provided between the inverters 212 and 213 in the power-supply domain D1. Additionally, the voltage conversion unit 220 according to the second embodiment is different from that of the first embodiment in that a differential amplifier circuit 245 is provided between the inverters 221 and 222 in the power-supply domain D1.

The differential amplifier circuit 240 amplifies a difference between delay signals A1 an A2 and supplies the resultant signal to the inverter 213. Additionally, the differential amplifier circuit 245 amplifies a difference between an input signal IN and a delay signal B1 and supplies the resultant signal to the inverter 222. Although the differential amplifier circuits 240 and 245 are provided, only one of the differential amplifier circuits 240 and 245 may be provided. Furthermore, the differential amplifier circuits 240 and 245 are provided in the power-supply domain D1, but may be provided in the power-supply domain D2 or in both of the power-supply domains D1 and D2. Moreover, the differential amplifier circuits 240 and 245 are merely examples of an amplifier unit described in the section "What is claimed is".

Figure 10:
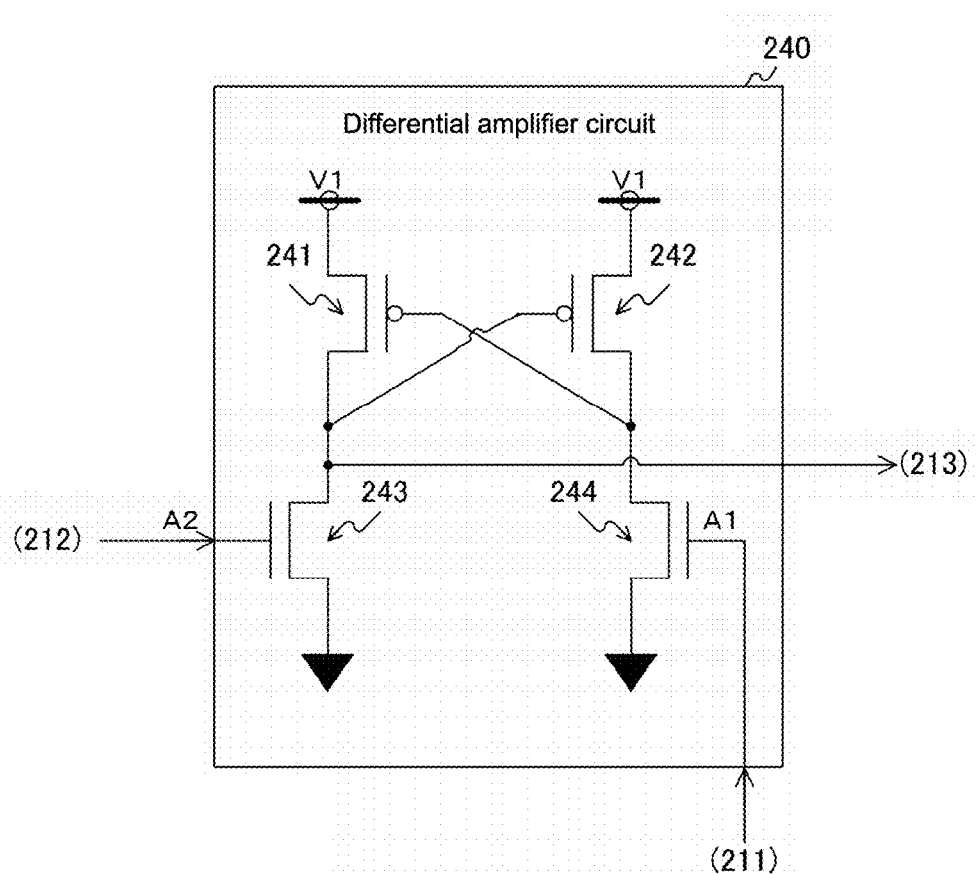
FIG. 10 is a circuit diagram showing a configuration example of a differential amplifier circuit according to the second embodiment.

FIG. 10 is a circuit diagram showing a configuration example of the differential amplifier circuit 240 according to the second embodiment. The differential amplifier circuit 240 includes transistors 241, 242, 243, and 244. The transistors 241 and 242 are p-type MOS transistors, for example, and the transistors 243 and 244 are n-type MOS transistors, for example. The configuration of the differential amplifier circuit 245 is the same as that of the differential amplifier circuit 240.

A gate terminal of the transistor 241 is connected to the transistors 242 and 244, a source terminal thereof is connected to the transistors 242 and 243 and to the inverter 213, and a drain terminal thereof is connected to a power-supply terminal. Additionally, a gate terminal of the transistor 242 is connected to the transistors 241 and 243 and to the inverter 213, a source terminal thereof is connected to the transistors 241 and 244, and a drain terminal thereof is connected to the power-supply terminal.

A gate terminal of the transistor 243 is connected to the inverter 212, a source terminal thereof is connected to the transistors 241 and 242 and to the inverter 213, and a drain terminal thereof is connected to a reference terminal. Additionally, a gate terminal of the transistor 244 is connected to the inverter 211, a source terminal thereof is connected to the transistors 241 and 242, and a drain terminal thereof is connected to the reference terminal.

With this configuration, a signal obtained by amplifying the difference between the delay signals A1 and A2 supplied from the inverters 211 and 212, respectively, is supplied to the inverter 213.

As described above, according to the second embodiment of the present disclosure, since the differential amplifier circuit 240 amplifies a signal and supplies the resultant signal to the inverter 213 at a subsequent stage, a signal can be transmitted accurately even when the difference in voltage between the input side and the output side is large.

3. Third Embodiment

In the first embodiment, as exemplified in FIG. 3, the output unit 250 generates an output signal by the transistors 251, 252, 253, and 254. The configuration of the output unit 250 is, however, not limited to the configuration exemplified in FIG. 3 if the exemplary operation shown in FIG. 4 can be achieved. For example, the output signal may be generated with an SR (Set-Reset) latch or the like. An output unit 250 according to a third embodiment is different from that of the first embodiment in that an SR latch is provided.

Figure 11:
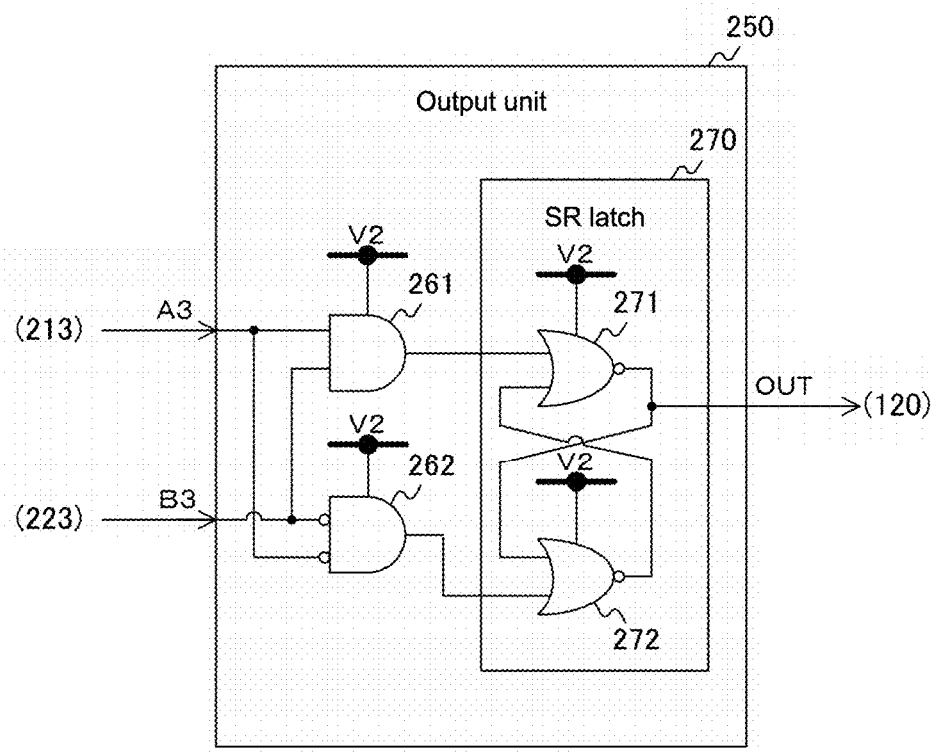
FIG. 11 is a circuit diagram showing a configuration example of an output unit according to a third embodiment.

FIG. 11 is a circuit diagram showing a configuration example of the output unit 250 according to the third embodiment. The output unit 250 according to the third embodiment includes AND (logical conjunction) gates 261 and 262 and an SR latch 270. The SR latch 270 includes NOR (negative OR) gates 271 and 272.

The AND gate 261 generates a set signal, which is a logical conjunction signal of the converted signals A3 and B3, and supplies the set signal to the SR latch 270. It should be noted that the AND gate 261 is an example of a set-signal-generating unit described in the section "What is claimed is".

The AND gate 262 generates a reset signal, which is a signal of the logical conjunction of a signal obtained by inverting the converted signal A3 and a signal obtained by inverting the converted signal B3, and supplies the reset signal to the SR latch 270. It should be noted that the AND gate 262 is an example of a reset-signal-generating unit described in the section "What is claimed is".

The NOR gate 271 generates an output signal OUT, which is a negative OR signal of a signal from the NOR gate 272 and the set signal, and supplies the output signal OUT to the internal circuit 120 and the NOR gate 272. The NOR gate 272 supplies a negative OR signal of the output signal OUT and the reset signal to the NOR gate 271.

With the NOR gates 271 and 272, in the case where the set signal is in high level and the reset signal is in low level, the signal in high level is output as the output signal OUT. Additionally, in the case where the set signal is in low level and the reset signal is in high level, the signal in low level is output as the output signal OUT. Additionally, in the case where voltages of the set signal and the reset signal are matched with each other, the output signal OUT generated in the case where the voltages are not matched with each other is held and output. As a result, the operation exemplified in FIG. 4 is achieved. It should be noted that the SR latch 270 is an example of a latch circuit described in the section "What is claimed is".

Additionally, in the case where the voltages of the converted signals A3 and B3 are matched with each other, the SR latch 270 outputs the output signal OUT, which is a signal obtained by inverting any of the converted signals, but may output the signal without inversion. In this case, for example, the NOR gate 272 output the output signal OUT, instead of the NOR gate 271.

In particular, for example, in a circuit in which the voltages of the converted signals A3 and B3 are not matched with each other for a relatively long period of time and in which the voltages may vary due to a leakage current, the configuration including the SR latch 270 shown in FIG. 11 provides a more stable operation than in the first embodiment. This is because, in the first embodiment, the voltage is held by a parasitic capacitance and a period of time during which the voltage can be held is not as long as that in the case of using the SR latch.

As described above, according to the third embodiment of the present disclosure, since the SR latch 270 generates the output signal in a period of time in which voltages of two converted signals are matched with each other while holding the output signal in a period of time in which the voltages are not matched with each other, the variation in duty ratio can be suppressed and a signal can be transmitted accurately.

4. Fourth Embodiment

In the first embodiment, as exemplified in FIG. 3, the output unit 250 generates an output signal by the transistors 251, 252, 253, and 254, but may generate an output signal with a flip-flop or the like. An output unit 250 according to a fourth embodiment is different from that of the first embodiment in that a flip-flop is provided.

Figure 12:
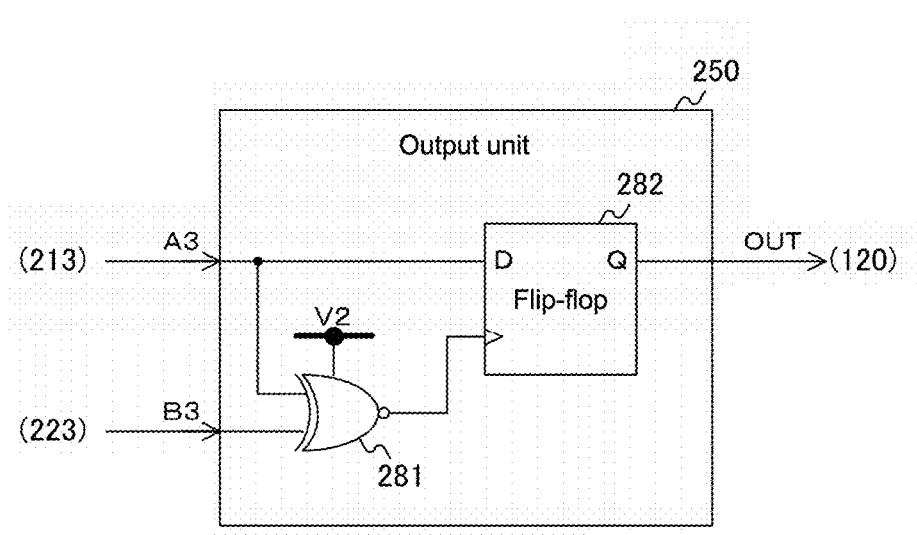
FIG. 12 is a circuit diagram showing a configuration example of an output unit according to a fourth embodiment.

FIG. 12 is a circuit diagram showing a configuration example of the output unit 250 according to the fourth embodiment. The output unit 250 according to the fourth embodiment includes an XOR gate 281 and a flip-flop 282.

The XOR gate 281 supplies a control signal, which is a signal obtained by inverting exclusive OR of converted signals A3 and B3, to the flip-flop 282. The control signal is in low level in the case where the voltages of the converted signals A3 and B3 are not matched with each other or in high level in the case where the voltages thereof are matched with each other. It should be noted that the XOR gate 281 is an example of a control-signal-generating unit described in the section "What is claimed is".

In the case where the control signal is in high level, that is, the voltages of the converted signals A3 and B3 are matched with each other, the flip-flop 282 outputs the converted signal A3 as an output signal OUT. Additionally, in the case where the control signal is in low level, the flip-flop 282 holds and outputs the output signal OUT.

It should be noted that the output unit 250 outputs the output signal OUT without inverting any one of the converted signals A3 and B3 in the case where the voltages of the converted signals A3 and B3 are matched with each other, but may output the output signal OUT after inverting any one of the converted signals A3 and B3. In such a case, for example, an inverter is additionally provided to an anterior or posterior stage of the flip-flop 282. Alternatively, the XOR gate 281 supplies the exclusive OR of the converted signals A3 and B3 as a control signal to the flip-flop 282 without inverting the exclusive OR.

In particular, for example, in a circuit in which the voltages of the converted signals A3 and B3 are not matched with each other for a relatively long period of time and in which the voltages may vary due to a leakage current, the configuration including the flip-flop 282 shown in FIG. 12 provides a more stable operation than in the first embodiment. This is because, in the first embodiment, the voltage is held by a parasitic capacitance and a period of time during which the voltage can be held is not as long as that in the case of using the flip-flop.

As described above, according to the fourth embodiment of the present disclosure, since the flip-flop 282 generates the output signal in the case where voltages of two converted signals are matched with each other while holding the output signal in the case where the voltages are not matched with each other, the variation in duty ratio can be suppressed and a signal can be transmitted accurately.

It should be noted that the embodiments described above are merely examples for embodying the present disclosure, and the matters in the embodiments and the matters specifying the present disclosure in the section "What is claimed is" have respective correspondence relationships. In the same manner, the matters specifying the present disclosure in the section "What is claimed is" and the matters according to the embodiments of the present disclosure, which are denoted by the same names as those in the former matters, have respective correspondence relationships. It should be noted that the present disclosure is not limited to the embodiments and can be variously modified without departing from the gist of the present disclosure.

It should be noted that the effects described herein are not necessarily limited, and any of the effects described herein may be provided.

It should be noted that the present disclosure can have the following configurations.

(1) A voltage conversion circuit, including:
a first voltage conversion unit configured to perform voltage conversion on an input signal, the voltage conversion causing a predetermined delay time, and supply a resultant signal as a first converted signal;
a second voltage conversion unit configured to perform voltage conversion on the input signal, the voltage conversion causing a delay time that is different from the predetermined delay time, and supply a resultant signal as a second converted signal; and
an output unit configured to generate and output an output signal corresponding to the first converted signal and the second converted signal in a matching period of time in which a voltage of the first converted signal and a voltage of the second converted signal are matched with each other, and continuously output the output signal in a period of time excluding the matching period of time, the output signal being output in the matching period of time.

(2) The voltage conversion circuit according to (1), in which
each of the first voltage conversion unit and the second voltage conversion unit includes the same number of logic inversion elements,
in the first voltage conversion unit, the number of logic inversion elements to which the same voltage as a voltage of the input signal is supplied is one more than the number of logic inversion elements of the second voltage conversion unit, and
in the second voltage conversion unit, the number of logic inversion elements to which the same voltage as a voltage of the output signal is supplied is one more than the number of logic inversion elements of the first voltage conversion unit.

(3) The voltage conversion circuit according to (1) or (2), in which
the output unit is configured
to connect one of a power-supply terminal and a reference terminal to an output terminal in a case where the voltage of the first converted signal and the voltage of the second converted signal are matched with each other, the reference terminal having a potential lower than a potential of the power-supply terminal, and output a signal of the potential of the connected terminal as the output signal from the output terminal, and
to continuously output the output signal without connecting any one of the power-supply terminal and the reference terminal to the output terminal, in a case where the voltage of the first converted signal and the voltage of the second converted signal are not matched with each other.

(4) The voltage conversion circuit according to (3), in which
the output unit includes
a first transistor configured to connect one of the power-supply terminal and the reference terminal to a first node in a case where the voltage of the second converted signal is in low level,
a second transistor configured to connect the first node to the output terminal in a case where the voltage of the first converted signal is in low level,
a third transistor configured to connect a second node to the output terminal in a case where the voltage of the first converted signal is in high level, and
a fourth transistor configured to connect the one of the power-supply terminal and the reference terminal to the second node in a case where the voltage of the second converted signal is in high level.

(5) The voltage conversion circuit according to (1) or (2), in which
the output unit includes
a set-signal-generating unit configured to generate a logical conjunction signal of the first converted signal and the second converted signal, as a set signal,
a reset-signal-generating unit configured to generate a logical conjunction signal of a signal obtained by inverting the first converted signal and a signal obtained by inverting the second converted signal, as a reset signal, and
a latch circuit configured
to output a signal as the output signal, the signal having a voltage that is the same as one of a voltage of the set signal and a voltage of the reset signal, in a case where the voltage of the set signal and the voltage of the reset signal are not matched with each other, and to hold and output the output signal in a case where the voltage of the set signal and the voltage of the reset signal are matched with each other.

(6) The voltage conversion circuit according to (1) or (2), further including:
a control-signal-generating unit configured to generate a control signal indicating whether the voltage of the first converted signal and the voltage of the second converted signal are matched with each other or not; and
a flip-flop configured to output one of the first converted signal and the second converted signal as the output signal in a case where the control signal indicates that the voltage of the first converted signal and the voltage of the second converted signal are matched with each other, and to hold and output the output signal in a case where the control signal indicates that the voltage of the first converted signal and the voltage of the second converted signal are not matched with each other.

(7) The voltage conversion circuit according to any one of (1) to (6), in which
at least one of the first voltage conversion unit and the second voltage conversion unit includes
an input-side logic inversion element configured to delay the input signal and supply a resultant signal as a delay signal,
an amplifier unit configured to amplify the delay signal, and
an output-side logic inversion element configured to perform voltage conversion on the amplified delay signal, the voltage conversion causing a delay time that is different from the predetermined delay time, and output a resultant signal as the output signal.

(8) An electronic circuit, including:
a first voltage conversion unit configured to perform voltage conversion on an input signal, the voltage conversion causing a predetermined delay time, and supply a resultant signal as a first converted signal;
a second voltage conversion unit configured to perform voltage conversion on the input signal, the voltage conversion causing a delay time that is different from the predetermined delay time, and supply a resultant signal as a second converted signal;
an output unit configured to generate and output an output signal corresponding to the first converted signal and the second converted signal in a matching period of time in which a voltage of the first converted signal and a voltage of the second converted signal are matched with each other, and continuously output the output signal in a period of time excluding the matching period of time, the output signal being output in the matching period of time; and
a processing circuit configured to perform predetermined processing using the output signal.

It should be understood by those skilled in the art that various modifications, combinations, sub-combinations and alterations may occur depending on design requirements and other factors insofar as they are within the scope of the appended claims or the equivalents thereof.

What is claimed is:

1. A voltage conversion circuit, comprising:
a first voltage conversion unit configured to perform voltage conversion on an input signal, the voltage conversion causing a predetermined delay time, and supply a resultant signal as a first converted signal;
a second voltage conversion unit configured to perform voltage conversion on the input signal, the voltage conversion causing a delay time that is different from the predetermined delay time, and supply a resultant signal as a second converted signal; and
an output unit configured to generate and output an output signal corresponding to the first converted signal and the second converted signal in a matching period of time in which a voltage of the first converted signal and a voltage of the second converted signal are matched with each other, and continuously output the output signal in a period of time excluding the matching period of time, the output signal being output in the matching period of time.

2. The voltage conversion circuit according to claim 1, wherein
each of the first voltage conversion unit and the second voltage conversion unit includes the same number of logic inversion elements,
in the first voltage conversion unit, the number of logic inversion elements to which the same voltage as a voltage of the input signal is supplied is one more than the number of logic inversion elements of the second voltage conversion unit, and
in the second voltage conversion unit, the number of logic inversion elements to which the same voltage as a voltage of the output signal is supplied is one more than the number of logic inversion elements of the first voltage conversion unit.

3. The voltage conversion circuit according to claim 2, wherein
the output unit includes
a first transistor configured to connect one of the power-supply terminal and the reference terminal to a first node in a case where the voltage of the second converted signal is in low level,
a second transistor configured to connect the first node to the output terminal in a case where the voltage of the first converted signal is in low level,
a third transistor configured to connect a second node to the output terminal in a case where the voltage of the first converted signal is in high level, and
a fourth transistor configured to connect the one of the power-supply terminal and the reference terminal to the second node in a case where the voltage of the second converted signal is in high level.

4. The voltage conversion circuit according to claim 1, wherein
the output unit is configured
to connect one of a power-supply terminal and a reference terminal to an output terminal in a case where the voltage of the first converted signal and the voltage of the second converted signal are matched with each other, the reference terminal having a potential lower than a potential of the power-supply terminal, and output a signal of the potential of the connected terminal as the output signal from the output terminal, and
to continuously output the output signal without connecting any one of the power-supply terminal and the reference terminal to the output terminal, in a case where the voltage of the first converted signal and the voltage of the second converted signal are not matched with each other.

5. The voltage conversion circuit according to claim 1, wherein
the output unit includes
a set-signal-generating unit configured to generate a logical conjunction signal of the first converted signal and the second converted signal, as a set signal,
a reset-signal-generating unit configured to generate a logical conjunction signal of a signal obtained by inverting the first converted signal and a signal obtained by inverting the second converted signal, as a reset signal, and a latch circuit configured
to output a signal as the output signal, the signal having a voltage that is the same as one of a voltage of the set signal and a voltage of the reset signal, in a case where the voltage of the set signal and the voltage of the reset signal are not matched with each other, and to hold and output the output signal in a case where the voltage of the set signal and the voltage of the reset signal are matched with each other.

6. The voltage conversion circuit according to claim 1, further comprising:
a control-signal-generating unit configured to generate a control signal indicating whether the voltage of the first converted signal and the voltage of the second converted signal are matched with each other or not; and
a flip-flop configured to output one of the first converted signal and the second converted signal as the output signal in a case where the control signal indicates that the voltage of the first converted signal and the voltage of the second converted signal are matched with each other, and to hold and output the output signal in a case where the control signal indicates that the voltage of the first converted signal and the voltage of the second converted signal are not matched with each other.

7. The voltage conversion circuit according to claim 1, wherein
at least one of the first voltage conversion unit and the second voltage conversion unit includes an input-side logic inversion element configured to delay the input signal and supply a resultant signal as a delay signal, an amplifier unit configured to amplify the delay signal, and an output-side logic inversion element configured to perform voltage conversion on the amplified delay signal, the voltage conversion causing a delay time that is different from the predetermined delay time, and output a resultant signal as the output signal.

8. An electronic circuit, comprising:
a first voltage conversion unit configured to perform voltage conversion on an input signal, the voltage conversion causing a predetermined delay time, and supply a resultant signal as a first converted signal;

a second voltage conversion unit configured to perform voltage conversion on the input signal, the voltage conversion causing a delay time that is different from the predetermined delay time, and supply a resultant signal as a second converted signal;

an output unit configured to generate and output an output signal corresponding to the first converted signal and the second converted signal in a matching period of time in which a voltage of the first converted signal and a voltage of the second converted signal are matched with each other, and continuously output the output signal in a period of time excluding the matching period of time, the output signal being output in the matching period of time; and a processing circuit configured to perform predetermined processing using the output signal.

* * * * *